United States Patent [19]

Arakawa

[11] Patent Number: 5,489,870
[45] Date of Patent: Feb. 6, 1996

[54] VOLTAGE BOOSTER CIRCUIT

[75] Inventor: Hideki Arakawa, Kanagawa, Japan

[73] Assignee: Sony Corporation, Tokyo, Japan

[21] Appl. No.: 214,145

[22] Filed: Mar. 17, 1994

[30] Foreign Application Priority Data

Mar. 18, 1993 [JP] Japan .................................. 5-058320

[51] Int. Cl.⁶ ...................................................... G05F 3/02
[52] U.S. Cl. ......................... 327/536; 327/534; 327/537; 327/337
[58] Field of Search .................. 307/296.2, 264, 307/246, 490, 259, 256, 303; 327/534, 536, 537, 390, 504, 565, 566, 337

[56] References Cited

U.S. PATENT DOCUMENTS 4,384,218  5/1983  Shimotori et al. ................... 307/296.2
5,081,371  1/1992  Wong .................................. 307/296.2

*Primary Examiner*—Timothy P. Callahan
*Assistant Examiner*—Jung Ho Kim
*Attorney, Agent, or Firm*—Hill, Steadman & Simpson

[57] ABSTRACT

A booster circuit which can cancel the back bias effect, can prevent the increase of the surface area of the circuit and the power consumption, prevent the complication of the clock generation circuit, and prevent lowering of the current capability, wherein a boosting stage is constituted by forming an nMOS transistor NT for carrying the charges and nMOS transistor NTB for transferring the voltage inside a p-well formed inside an n-well which is formed on a p-type semiconductor substrate and biased to a predetermined potential, constituted so that the source voltage of the nMOS transistor NT for carrying the charges which rise at the boosting is transferred via the nMOS transistor NTB for transferring the voltage to the substrate, that is, the p-well, whereby the back bias effect is suppressed.

6 Claims, 16 Drawing Sheets

FIG. 6
(PRIOR ART)
φ5 
φ6 
φ7 
φ8 

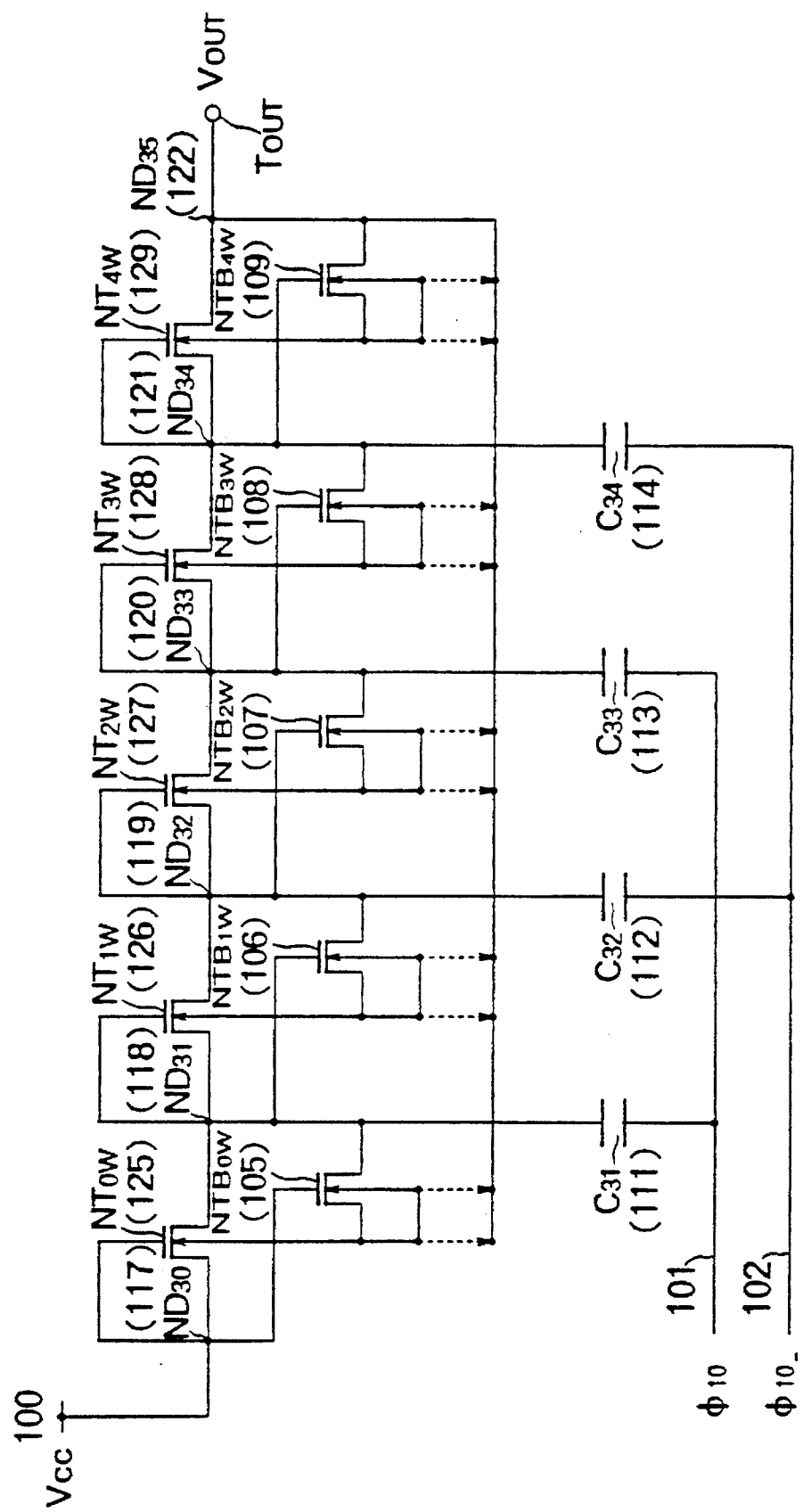

us,489,870

VOLTAGE BOOSTER CIRCUIT

BACKGROUND OF THE INVENTION

1. Field of the Invention

The present invention relates to a booster circuit used for a semiconductor memory device etc.

2. Description of the Related Art

A semiconductor memory device, for example, a flash memory, is provided with a voltage booster circuit which boosts the reference power source voltage, for example, 5 V, to a high voltage of 12 to 20 V and a negative high voltage of −6 V to −20 V and supplies the resultant voltage to a predetermined functional block.

FIG. 1 is a circuit diagram showing a general voltage booster circuit of a positive voltage for obtaining an output of 20 V by boosting a power source voltage of for example +5 V.

In FIG. 1, $V_{cc}$ denotes a power source voltage; 1 denotes a voltage feeding line of the power source voltage; $NT_0$ to $NT_4$ (5 to 9) denote n-channel MOS (metal oxide semiconductor) transistors (hereinafter, referred to as nMOS transistors); $C_1$ to $C_4$ (17 to 20) denote capacitors for pumping; $ND_0$ to $ND_4$ (11 to 15) denote nodes; $T_{OUT}$ (21) denotes an output terminal; $V_{OUT}$ denotes an output signal; and $\phi_1$ (2) and $\phi_{1\_}$ (3) denote clock signals of mutually complementary levels; respectively.

The nMOS transistors $NT_0$ to $NT_4$ (5 to 9) are connected in a form of cascade, the drain of the nMOS transistor $NT_0$ (5) is connected to the line i of the power source voltage $V_{cc}$, and the source of the nMOS transistor $NT_4$ (9) is connected to the output terminal $T_{OUT}$ (21).

The node $ND_0$ (11) is constituted by a point of connection between the line 1 of the power source voltage $V_{cc}$ and the nMOS transistor $NT_0$ (5); the node $ND_1$ (12) is constituted by the point of connection between the source of the nMOS transistor $NT_0$ (5) and the drain of the nMOS transistor $NT_1$ (6); the node $ND_2$ (13) is constituted by the point of connection between the source of the nMOS transistor $NT_1$ (6) and the drain of the nMOS transistor $NT_2$ (7); the node $ND_3$ (14) is constituted by the point of connection between the source of the nMOS transistor $NT_2$ (7) and the drain of the nMOS transistor $NT_3$ (8); and the node $ND_4$ (15) is constituted by the point of connection between the source of the nMOS transistor $NT_3$ (8) and the drain of the nMOS transistor $NT_4$ (9); respectively.

The nMOS transistors $NT_0$ to $NT_4$ (5 to 9) are "diode-connected", with the drains and gates being connected. Namely, the node $ND_0$ (11) and the gate of the nMOS transistor $NT_0$ (5) are connected; the node $ND_1$ (12) and the gate of the nMOS transistor $NT_1$ (6) are connected; the node $ND_2$ (13) and the gate of the nMOS transistor $NT_2$ (7) are connected; the node $ND_3$ (14) and the gate of the nMOS transistor $NT_3$ (8) are connected; and the node $ND_4$ (15) and the gate of the nMOS transistor $NT_4$ (9) are connected.

The nodes $ND_1$ to $ND_4$ (12 to 15) are connected to the pumping capacitors $C_1$ to $C_4$ (17 to 20), respectively; the capacitors $C_1$ (17) and $C_3$ (19) are connected to an input line of the clock signal $\phi_1$ (2); and the capacitors $C_2$ (18) and $C_4$ (20) are connected to the input line of the clock signal $\phi_{1\_}$ (3).

The clock signals $\phi_1$ (2) and $\phi_{1\_}$ (3) are complementary signals which alternately take the power source voltage $V_{cc}$ level and "0" V level in a predetermined cycle.

Accordingly, when the clock signal $\phi_1$ is at the $V_{cc}$ level, the nodes $ND_1$ (12) and $ND_3$ (14) are boosted (raised up) by the amount of for example the voltage $V_c$ by the capacitance connection of the capacitors $C_1$ (17) and $C_3$ (19). At this time, since the clock signal $\phi_{1\_}$ (3) is at "0" V, the nodes $ND_2$ (12) and $ND_4$ (15) are pulled down (lowered in level).

On the other hand, when the clock signal $\phi_1$ (2) is at "0" level, the nodes $ND_1$ (12) and $ND_3$ (13) are lowered in level. At this time, since the clock signal $\phi_{1\_}$ (3) is at the $V_{cc}$ level, the nodes $ND_2$ (13) and $ND_4$ (15) are raised up by the amount of the voltage $V_c$ by the capacitance connection of the capacitors $C_2$ (18) and $C_4$ (20).

FIG. 3 is a waveform diagram showing the process of boosting of the nodes $ND_1$ (12) and $ND_2$ (13) in the positive booster circuit of FIG. 1.

As shown in FIG. 3, in the booster circuit of FIG. 1, by inputting the clock signals $\phi_1$ (2) and $\phi_{1\_}$ (3) taking complementary levels to the pumping capacitors $C_1$ to $C_4$ (17 to 20), a current is passed toward the output side, so that the charges of the capacitors $C_1$ to $C_4$ (17 to 20) are sequentially transported.

More specifically, in the period a shown in the diagram, the clock signal $\phi_1$ (2) is at the $V_{cc}$ level and input to the capacitor $C_1$ (17), and the clock signal $\phi_{1\_}$ (3) is at the "0" V and input to the capacitor $C_2$ (18).

Accordingly, the node $ND_1$ (12) is boosted (raised) by the amount of the voltage $V_c$ by the capacitance connection of the capacitor $C_1$ (17), while the node $ND_2$ (13) is lowered by the amount of the voltage $V_c$.

Along with the boosting of the node $ND_1$ (12), the voltage $v_c$ is applied to the nMOS transistor $NT_1$ (6), and therefore a current $i_1$ is passed toward the node $ND_2$ (13) of the next stage, and the charges of the capacitor $C_1$ (17) are transported to the node $ND_2$ (13).

Along with this, the voltage $V_2$ of the node $ND_2$ (13) slightly rises at the point of time at which the period a is ended.

In the next period b, the clock signal $\phi_1$ (2) is input to the capacitor $C_1$ (17) at "0" V, and the clock signal $\phi_{1\_}$ (3) is input to the capacitor $C_2$ (18) at the $V_{cc}$ level.

Accordingly, the capacitance connection of the capacitor $C_1$ (17) is not carried at the node $ND_1$ (11). This is lowered by the amount of the voltage $V_c$, and the node $ND_2$ (13) is raised by the amount of the voltage $V_c$. Accordingly, the voltage $V_2$ at the node $ND_2$ (13) becomes the next value obtained by adding the amount of the rising voltage (+)α by the inflow of the current $i_1$:

$$V_2 = V_c + \alpha \tag{1}$$

By this, the nMOS transistor $NT_1$ (6) becomes the OFF state and the current $i_1$ no longer flows, so that the charges are transported to the node $ND_2$ (12) of the next stage, which means that the voltage $V_2$ of the node $ND_2$ (12), that is, the source voltage of the nMOS transistor $NT_1$ (6), rises.

Along with the boosting of the node $ND_2$ (13), the voltage $(V_c+\alpha)$ is applied to the gate of the nMOS transistor $NT_2$ (7), and therefore the current $i_2$ flows toward the node $ND_3$ (14) of the next stage, and the charges of the capacitor $C_2$ (18) are transported to the node $ND_2$ (12).

Along with this, the voltage of the node $ND_3$ (14) further rises at the point of time when the period b is ended.

An operation similar to the above is repeated, and the predetermined high voltage output $V_{OUT}$ appears at the output terminal $T_{OUT}$ (21).

Where the charges are transported to the node $ND_2$ (13) of the next stage via for example the nMOS transistor $NT_1$ (6) in this booster circuit, that is, when the current $i_1$ flows, the source voltage of the nMOS transistor $NT_1$ (6)=drain voltage of the nMOS transistor $NT_1$ (6)=gate voltage of the nMOS transistor $NT_1$ (6)=$V_1$ stands, and therefore it is necessary to satisfy the following relationship:

$$V_1 - V_2 > V_{th} \quad (2)$$

Here, $V_{th}$ indicates the threshold voltage of the nMOS transistor.

Accordingly, a condition with which the current $i_1$ flows and the charges are transported becomes as follows if the voltage at which the nodes $ND_1$ (12) and $ND_2$ (13) are raised/lowered by the capacitors $C_1$ (17) and $C_2$ (18) as mentioned above is $V_c$:

$$(V_1 + V_c) - (V_2 - V_c) > V_{th(1)}$$

Namely, $$2V_c - V_{th(1)} > V_2 - V_1 \quad (3)$$

A circuit of FIG. 1 satisfying this condition can sequentially shift the charges of the capacitors $C_1$ to $C_4$ (17 to 20) to the output terminal $T_{OUT}$ (21) through the node $ND_1$ (11) to the node $ND_4$ (15) using the complementary clock signals $\phi_1$ (2) and $\phi_{1\_}$ (3) and can boost the power source voltage $V_{cc}$ to the desired voltage.

FIG. 4 is a circuit diagram showing a negative booster circuit for obtaining a negative high voltage.

The point of difference of this circuit from the positive booster circuit of FIG. 1 resides in a fact that pMOS transistors $PT_0$ to $PT_4$ (40 to 44) are used in place of the nMOS transistors $NT_0$ to $NT_4$ (5 to 9) and in that the node $ND_{10}$ (31) is grounded in place of the power source voltage $V_{cc}$.

In the case of this negative booster circuit, the current flows from the output side toward the ground, a charge shift is performed along with the input of the clock signals $\phi_2$ (52) and $\phi_{2\_}$ (53) to the capacitors $C_{11}$ to $C_{14}$ (47 to 50), and the negative voltage is gradually accumulated in the output terminal $T_{OUT}$ (36), so that the negative high voltage output $V_{OUT}$ is obtained.

The threshold voltage $V_{th}$ of the MOS transistor is susceptible to the influence of a so-called back bias effect wherein the threshold voltage is increased when the source voltage rises.

Here, when it is assumed that the threshold voltage $V_{th}$ when the substrate voltage=source voltage=0 V is "0.8 V", the threshold voltage $V_{th}$ when the source voltage is 10 or so volts becomes about 2 V. For this reason, there is a problem in that as the number of boosting stages is increased and the voltage becomes higher, so the efficiency per stage is degraded.

In the above-mentioned equation (3), when it is assumed that there is no back bias effect and $V_c$=4 V, the following stands:

$$V_2 - V_1 < 8 - 0.8 \; V = 7.2 \; V$$

but when the threshold voltage $V_{th}$ becomes equal to 2 V by the back bias effect, the following stands:

$$V_2 - V_1 < 8 - 2 = 6 \; V$$

When it is assumed that the operation must be performed even at 2.5 V so as to guarantee the operation of the power source voltage 3.0 V, if $V_c$=2 V, the following comes to stand:

$$V_2 - V_1 < 4 - 2 = 2 \; V$$

Conventionally, so as to avoid the influence by this back bias effect, a countermeasure in which the threshold voltage $V_{th}$ of the transistors of a part of a higher level of the stages, for example, nMOS transistors $NT_3$ (8) and $NT_4$ (9) Of FIG. 1, is lowered and brought to 0 V has been carried out. By taking this countermeasure, however, there is a problem in that the manufacturing process becomes cumbersome etc.

Moreover, there has also been proposed a voltage booster circuit constituted so that the gate voltage is raised by the amount of increase of the threshold voltage $V_{th}$ by the back bias effect as shown in FIGS. 11 and 13 of the document entitled the IEEE JOURNAL OF SOLID-STATE CIRCUITS. VOL. 27. NO. 11, 1992, pp 1540 to 1546.

FIG. 5 is a circuit diagram showing the positive booster circuit disclosed in FIG. 13 of this document.

This circuit is constituted in that, in addition to the circuit of FIG. 1, the capacitors $CG_1$ to $CG_4$ (87 to 90) for boosting the gates are connected to the gates of the respective nMOS transistors $NT_{20}$ to $NT_{23}$ (12 to 75); the nMOS transistors $NTG_0$ to $NTG_3$ (61 to 64) are inserted and connected between the respective nodes $ND_{20}$ to $ND_{23}$ (66 to 69) and the gates of the nMOS transistors $NT_{20}$ to $NT_{23}$ (72 to 75); and the gates of the respective nMOS transistors $NTG_0$ to $NTG_3$ (61 to 64) are connected to the nodes $ND_{21}$ to $ND_{24}$ (67 to 70) of the one later stage.

So as to actuate this circuit, four phase clock signals $\phi_5$ to $\phi_8$ set up at the timing as shown in FIG. 6 are input to the respective capacitors $C_{21}$ to $C_2$ (93 to 96) and $CG_1$ to $CG_4$ (87 to 90) at a predetermined timing.

Specifically, the clock signal $\phi_7$ is input to the node pumping capacitors $C_{21}$ and $C_{23}$, the clock signal $\phi_5$ is input to the capacitors $C_{22}$ (93) and $C_{24}$ (96), respectively, the clock signal $\phi_6$ is input to the gate pumping capacitors $CG_1$ (87) and $CG_3$ (89), and the clock signal $\phi_8$ is input to the capacitors $CG_2$ (89) and $CG_4$ (90), respectively.

Here, for simplification, a case where for example the clock signal $\phi_5$ is input to the capacitor $C_{22}$ (94) at the $V_{cc}$ level and the clock signal $\phi_7$ is input to the capacitor $C_{23}$ (95) at "0" V is assumed.

In this case, the node $ND_{22}$ (68) is in the boosting state, and the node $ND_{23}$ (69) is in the lowered state. Accordingly, the gate voltage of the nMOS transistor $NTG_2$ (63) is at the same level as the level of the node $ND_{23}$ (69), and therefore the nMOS transistor $NTG_2$ (63) is retained in the OFF state.

In this state, when the clock signal $\phi_6$ becomes the $V_{cc}$ level, by the capacitance connection of the capacitor $CG_3$ (89), the gate voltage of the nMOS transistor $NT_{22}$ (74) is raised to a level that can cancel the back bias effect.

For this reason, the charges of the capacitor $C_{22}$ (94) are transferred well to the node $ND_{23}$ (69) via the nMOS transistor $NT_{22}$ (68).

Next, when the clock signal $\phi_5$ is switched to "0" V and the clock signal $\phi_8$ is switched to the $V_{cc}$ level, the node $ND_{22}$ is lowered, and the node $ND_{23}$ is boosted. At this time, the clock signal $\phi_6$ is switched to "0" V.

Since the node $ND_{23}$ (69) is in the boosting state, also the gate voltage of the nMOS transistor $NTG_2$ (63) becomes the high level, and the nMOS transistor $NTG_2$ (63) becomes the ON state. By this, the node $ND_{22}$ (68) and the node $NG_2$ (83) on the gate side of the nMOS transistor $NT_{22}$ (74) become the same potential, and therefore a current is not passed from the node $ND_{23}$ (69) to the node $ND_{22}$ (68).

However, the circuit of FIG. 5 has the following problem.

Namely, since a voltage higher than the output voltage is applied on the gate of the nMOS transistor, it is necessary to increase the gate voltage resistance by that amount in consideration of the transition state etc. Accordingly, processing for making the gate oxide film thicker is necessary.

Also, since four phase clock signals $\phi_5$ to $\phi_8$ are used, the clock generation circuit becomes complex, and since the gate pumping capacitors $CG_1$ to $C_4$ (87 to 90) are necessary, an increase of the surface area of the circuit and power consumption is induced.

Since the ratio between the pumping capacitors of the respective nodes and the parasitic capacitance becomes bad, operation with slow voltage source is difficult. Namely, the maximum voltage for boosting the gate is the power source voltage times the above-described capacitance ratio, and therefore 2.0 V is the limit even if the capacitance ratio is brought to 80% where the power source voltage is 2.5 V, and thus it is not possible to cancel the amount of increase of the threshold voltage $V_{th}$ by the back bias effect.

Also, it is a so-called non-overlap type four phase pulse, and therefore it is not possible to raise the frequency that high, which consequently lowers the current capability.

SUMMARY OF THE INVENTION

The present invention was made in consideration with such a circumstance and has as an object thereof to provide a booster circuit with which the back bias effect can be cancelled and the prevention of increase of the surface area of the circuit and power consumption, the prevention of complication of the clock generation circuit, and the prevention of the lowering of the current capability can be achieved.

So as to achieve the above-described object, according to the present invention, there is provided a circuit which has a first transistor operatively connecting a first node and a second node which are connected to a boosting element and which are complementarily boosted and a second transistor which operatively connects the second node and a substrate well of the above-described first transistor, the above-described first node being connected to a gate of the above-described first transistor and a gate of the above-described second transistor, and the substrate well of the above-described first transistor and the substrate well of the second transistor being connected.

According to the present invention, also, there is provided a circuit which has a first transistor operatively connecting a first node and a second node which are connected to a boosting element and which are complementarily boosted and a second transistor which operatively connects the above-described first node and a substrate well of the above-described first transistor, the above-described first node being connected to a gate of the above-described first transistor, the above-described second node being connected to a gate of the above-described second transistor, and the substrate well of the above-described first transistor and the substrate well of the second transistor being connected.

According to the present invention, there is further provided a circuit which has a first substrate well comprising a first conductivity type semiconductor region biased to a predetermined potential; a second substrate well comprising a second conductivity type semiconductor region formed in the first substrate well; first, second, third, and fourth element side diffusion layers comprising at least three first conductivity type element side diffusion layers formed inside the second substrate well; a fifth element side diffusion layer comprising the second conductivity type element side diffusion layer formed inside the second substrate well; a first gate electrode formed on a space between the above-described first and second element side diffusion layers; and a second gate electrode formed on the space between the above-described third and fourth element side diffusion layers, the above-described first element side diffusion layer being connected to the above-described first and second gate electrodes, the above-described second element side diffusion layer being connected to the above-described third element side diffusion layer, and the above-described fourth element side diffusion layer being connected to the above-described fifth element side diffusion layer.

According to the present invention, there is further provided a circuit which has a first substrate well comprising a first conductivity type semiconductor region biased to a predetermined potential; a second substrate well comprising a second conductivity type semiconductor region formed in the first substrate well; first, second, third, and fourth element side diffusion layers comprising at least three first conductivity type element side diffusion layers formed inside the second substrate well; a fifth element side diffusion layer comprising the second conductivity type element side diffusion layer formed inside the second substrate well; a first gate electrode formed on a space between the above-described first and second element side diffusion layers; and a second gate electrode formed on the space between the above-described third and fourth element side diffusion layers, the above-described first element side diffusion layer being connected to the above-described third element side diffusion layer and first gate electrode, the above-described second element side diffusion layer being connected to the above-described second gate electrode, and the above-described fourth element side diffusion layer being connected to the above-described fifth element side diffusion layer.

According to the present invention, the above-described first conductivity type is set to an n-type and the above-described second conductivity type is set to a p-type.

According to the present invention, when for example the first node is boosted by the boosting element, and the second node is raised up, along with the boosting of the first node, a high voltage is applied to the gate of the first transistor, and therefore the first transistor becomes the ON state, so that the current is passed from the first node toward the second node, and the charges of for example the boosting element are transported to the second node.

Along with this, the voltage of the second node gradually rises.

At this time, a high voltage of the boosted first node is applied to the gate of the second transistor, and therefore the second transistor becomes the ON state.

As a result, the voltage of the second node and the voltage of the substrate well become the same level.

Here, when the first node is lowered and the second node is raised, the voltage of the second node becomes a value obtained by adding the amount of the voltage plus a certain margin raised by the inflow of the current to the voltage boosted by the boosting element.

By this, the first transistor and the second transistor become the OFF state since the gate voltage is lowered, and the current no longer flows.

Also, the voltage on the connection end side with the substrate well of the second transistor becomes the differential voltage between the gate voltage of the second transistor, that is, the first node voltage, and the threshold voltage $V_{th}$.

The voltage on the connection end side of the second transistor at this time and the voltage of the substrate well are equal, and therefore the threshold voltage Vth of the first transistor is not susceptible much at all to the influence of the back bias effect.

According to the present invention, even in a construction in which the first node and the substrate well are operationally connected by the second transistor, and the second node is connected to the gate of the second transistor, the influence of the back bias effect is avoided.

BRIEF DESCRIPTION OF THE DRAWINGS

The above objects and features and other objects and features of the present invention will be apparent from the description with reference to the accompanying drawings, in which:

FIG. 6 is a view indicating the example of the waveform of the four phase clock signal used in the booster circuit of FIG. 5;

FIG. 7 is a circuit view indicating a first embodiment of a booster circuit according to the present invention;

FIGS. 8A and 8B are views for explaining a well-in-well construction according to the present invention, in which FIG. 8A is a schematic cross-sectional view and FIG. 8B is a view indicating the structure of FIG. 8A using circuit symbols;

DESCRIPTION OF THE PREFERRED EMBODIMENTS

FIG. 7 is a circuit diagram showing a first embodiment of a booster circuit according to the present invention.

$NT_{0W}$ to $NT_{4W}$ (125 to 129) denote the nMOS transistors for carrying the charges; $NTB_{0W}$ to $NTB_{4W}$ (105 to 109) denote the nMOS transistors for transferring the voltage; $ND_{30}$ to $ND_{35}$ (117 to 122) denote nodes; $C_{31}$ to $C_{34}$ (111 to 114) denote capacitors for pumping the nodes; $V_{cc}$ denotes the power source voltage; $T_{OUT}$ (122) denotes the output terminal; $V_{OUT}$ denotes the output voltage; and $\phi_{10}$ and $\phi_{10\_}$ denote the clock signals taking the mutually complementary levels; respectively.

The nMOS transistors $NT_{0W}$ to $NT_{4W}$ (125 to 129) and $NTB_{0W}$ to $NTB_{4W}$ (105 to 109) used in the present circuit are formed inside the same p-well having a so-called well-in-well (double well) construction.

Here, an explanation will be made of a fundamental structure of the well-in-well construction.

Figure 8A:
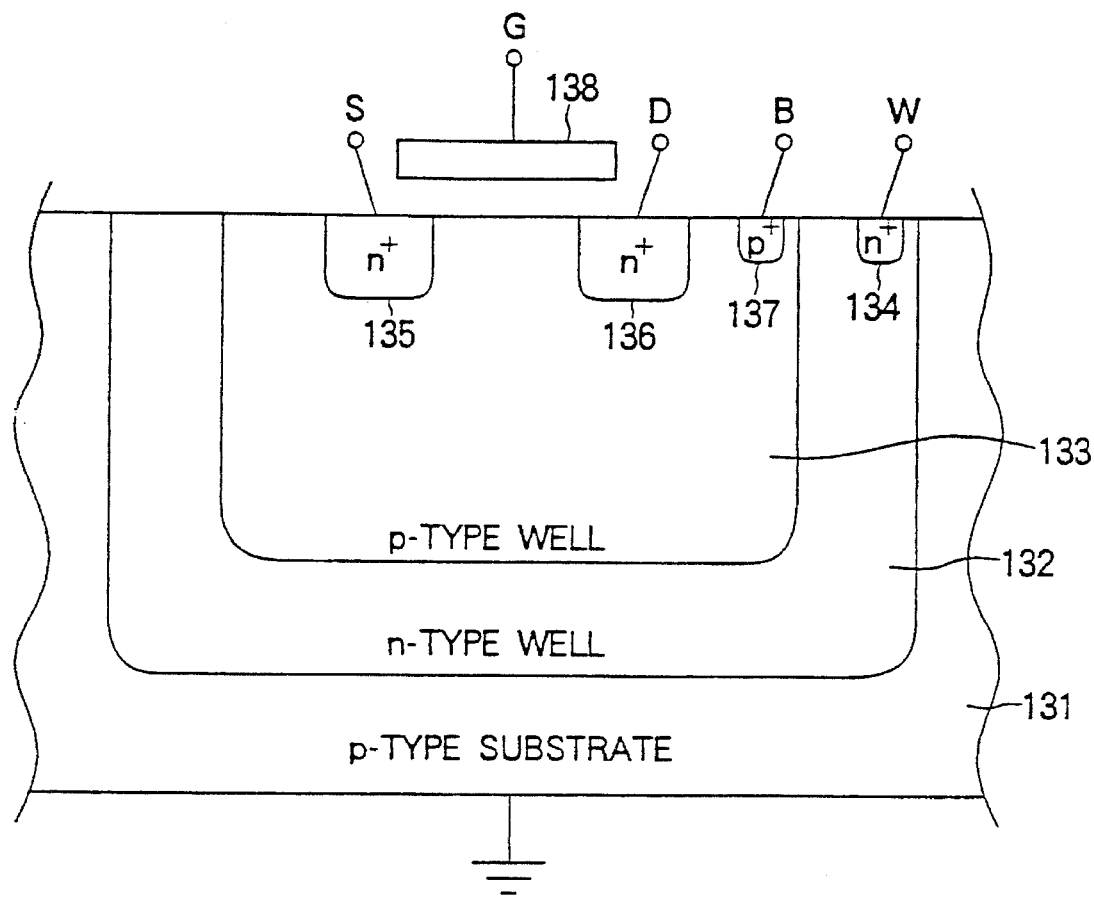
Figure 8B:
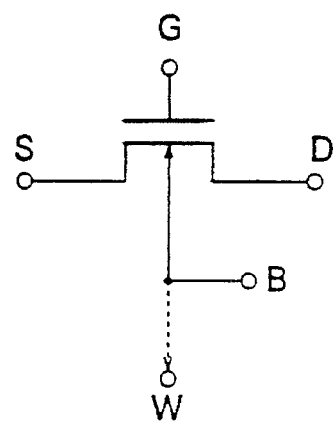

FIG. 8 diagrammatically shows the fundamental structure of the well-in-well construction adopted in the present embodiment, in which FIG. 8A of the figure is a schematic cross-sectional view; and FIG. 8B of the figure is a view expressing the nMOS transistor adopting the well-in-well construction using the circuit symbols.

In FIG. 8A, 131 denotes a p-type semiconductor substrate; 132 denotes an n-well; 133 denotes a p-well; 134 to 136 denote $n^+$ diffusion layers; 137 denotes a $p^+$ diffusion layer; and 138 denotes a gate electrode; respectively.

In the present structure, an n-well 132 which is the substrate side diffusion layer is formed on the surface of the semiconductor substrate 131 constituted by a grounded single crystal silicon substrate, etc., and the $n^+$ diffusion layer 134 is formed on the surface of the n-well 132.

Further, in the present structure, the p-well 133 is formed inside the n-well 132. On the surface inside the p-well 133, $n^+$ diffusion layers 135 and 136 which are the element side diffusion layers and the $p^+$ diffusion layer 137 for the takeout electrode are formed.

Then, the nMOS transistor is constituted by the $n^+$ diffusion layers 135 and 136 and the gate electrode 138. For example, the $n^+$ diffusion layer 135 functions as the drain and the $n^+$ diffusion layer 136 functions as the source.

FIG. 8B shows the nMOS transistor adopting such a well-in-well construction as mentioned above using the circuit symbols and shows the same using the same symbols as those in FIG. 7.

In the circuit of FIG. 7, the nMOS transistors $NT_{0W}$ (125) and $NTB_{0W}$ (105), $NT_{1W}$ (126) and $NTB_{1W}$ (106), $NT_{2W}$ (127) and $NTB_{2W}$ (107), $NT_{3W}$ (128) and $NTB_{3W}$ (108), and $NT_{4W}$ (129) and $NTB_{4W}$ (109) are formed inside the same p-well 133, respectively.

Figure 9:
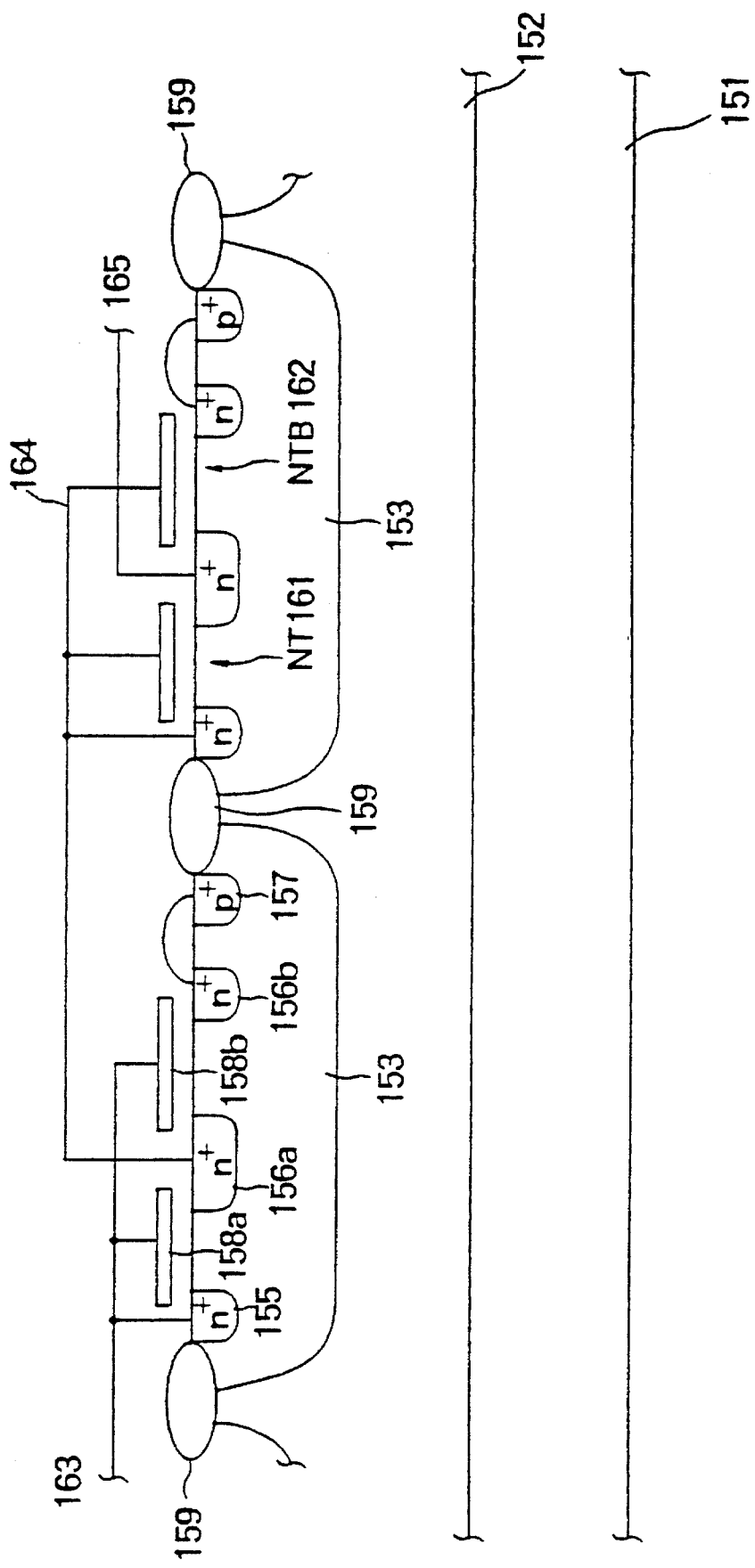
FIG. 9 is a schematic cross-sectional view showing one example of constituting the principal part of the circuit of FIG. 7 by adopting the well-in-well construction.

FIG. 9 diagrammatically shows this construction.

In the circuit of FIG. 7, for example as shown in FIG. 9, the nMOS transistor NT for carrying charges and the nMOS transistor NTB for transferring the voltage are constituted in such a manner that three $n^+$ diffusion layers 155, 156a, and 156b and one $p^+$ diffusion layer 157 are formed inside one p-well 153, the gate electrodes 158a and 158b are formed on a space between the $n^+$ diffusion layer 155 and 156a and on the space between the $n^+$ diffusion layers 156a and 156b, and the $n^+$ diffusion layer 156b and $p^+$ diffusion layer 157 constituting the nMOS transistor NTB for transferring the voltage are connected, whereby one boosting stage is constituted.

Five such p-wells 153 are formed inside the n-well 152 via the selective oxide element isolation region 159, and the $n^+$ diffusion layer 134 of the n-well 152 is connected to the terminal retained at a predetermined potential, for example, the output terminal $T_{OUT}$, whereby a principal part excluding the pumping capacitor of the circuit of FIG. 7 is constituted.

An explanation will be made below of the relationship of connection of the circuit of FIG. 7 using the nMOS transistor adopting the well-in-well construction as mentioned above.

The nMOS transistors $NT_{0W}$ to $NT_{4W}$ (125 to 129) are connected in cascade, the drain of the nMOS transistor $NT_{0W}$ (125) is connected to the line 100 of the power source voltage $V_{cc}$, and the source of the nMOS transistor $NT_{4W}$ (129) is connected to the output terminal $T_{OUT}$.

The node $ND_{30}$ (117) is constituted by a point of connection between the line 100 of the power source voltage $V_{cc}$ and the nMOS transistor $NT_{0W}$ (125); the node $ND_{31}$ (118) is constituted by the point of connection between the source of the nMOS transistor $NT_{0W}$ (125) and the drain of the nMOS transistor $NT_{1W}$ (126); the node $ND_{32}$ (119) is constituted by the point of connection between the source of the nMOS transistor $NT_{1W}$ (126) and the drain of the nMOS transistor $NT_{2W}$ (127); the node $ND_{33}$ (120) is constituted by the point of connection between the source of the nMOS transistor $NT_{2W}$ (127) and the drain of the nMOS transistor $NT_{3W}$ (128); the node $ND_{34}$ (121) is constituted by the point of connection between the source of the nMOS transistor $NT_{3W}$ (128) and the drain of the nMOS transistor $NT_{4W}$ (129); and the node $ND_{35}$ is constituted by the point of connection between the source of the nMOS transistor $NT_{4W}$ (129) and the output terminal $T_{OUT}$; respectively.

Also, the respective nMOS transistors $NT_{0W}$ to $NT_{4W}$ (125 to 129) are "diode-connected" with the drain and gate connected.

Namely, the node $ND_{30}$ (117) and the gate of the nMOS transistor $NT_{0W}$ (125) are connected; the node $ND_{31}$ (118) and the gate of the nMOS transistor $NT_{1W}$ (126) are connected; the node $ND_{32}$ (119) and the gate of the nMOS transistor $NT_{2W}$ (127) are connected; the node $ND_{33}$ (120) and the gate of the nMOS transistor $NT_{3W}$ (128) are connected; and the node $ND_{34}$ (121) and the gate of the nMOS transistor $NT_{4W}$ (129) are connected.

The nodes $ND_{31}$ to $ND_{34}$ (118 to 121) are connected to the pumping capacitors $C_{31}$ to $C_{34}$ (111 to 114), respectively; the capacitors $C_{31}$ (111) and $C_{33}$ (113) are connected to an input line 101 of the clock signal $\phi_{10}$; and the capacitors $C_{32}$ (112) and $C_{34}$ (114) are connected to an input line 102 of the clock signal $\phi_{10-}$.

Further, at each boosting stage, the drain of the nMOS transistor $NTB_{0W}$ (105) is connected to the node $ND_{31}$ (118), the gate is connected to the node $ND_{30}$ (117), and the source is connected to the substrate well of the nMOS transistor $NT_{0W}$ (125), that is, the p-well 153 of FIG. 9, and connected to the p$^+$ diffusion layer 157.

The drain of the nMOS transistor $NTB_{1W}$ (106) is connected to the node $ND_{32}$ (119), the gate is connected to the node $ND_{31}$ (118), and the source is connected to the substrate well of the nMOS transistor $NT_{1W}$ (126), that is, the p-well 153 of FIG. 9, and connected to the p$^+$ diffusion layer 157.

The drain of the nMOS transistor $NTB_{2W}$ (107) is connected to the node $ND_{33}$ (120), the gate is connected to the node $ND_{32}$ (119), and the source is connected to the substrate well of the nMOS transistor $NT_{2W}$ (127), that is, the p-well 153 of FIG. 9, and connected to the p$^+$ diffusion layer 157.

The drain of the nMOS transistor $NTB_{3W}$ (108) is connected to the node $ND_{34}$ (121), the gate is connected to the node $ND_{33}$ (120), and the source is connected to the substrate well of the nMOS transistor $NT_{3W}$ (128), that is, the p-well 153 of FIG. 9, and connected to the p$^+$ diffusion layer 157.

The drain of the nMOS transistor $NTB_{4W}$ (129) is connected to the node $ND_{35}$ (122), the gate is connected to the node $ND_{34}$ (121), and the source is connected to the substrate well of the nMOS transistor $NT_{4W}$ (129), that is, the p-well 153 of FIG. 9, and connected to the p$^+$ diffusion layer 157.

Also, the n$^+$ diffusion layer 154 in the n-well 152 of FIG. 9 is connected to the node $ND_{35}$ (122), and the n-well 152 is biased to a predetermined potential.

As explained above, the constitution is made using an nMOS transistor NT for carrying the charges having the well-in-well construction and the nMOS transistor NTB for transferring the voltage at each boosting stage, whereby an influence by the back bias effect of the nMOS transistor NT for carrying the charges can be effectively cancelled.

Figure 10:
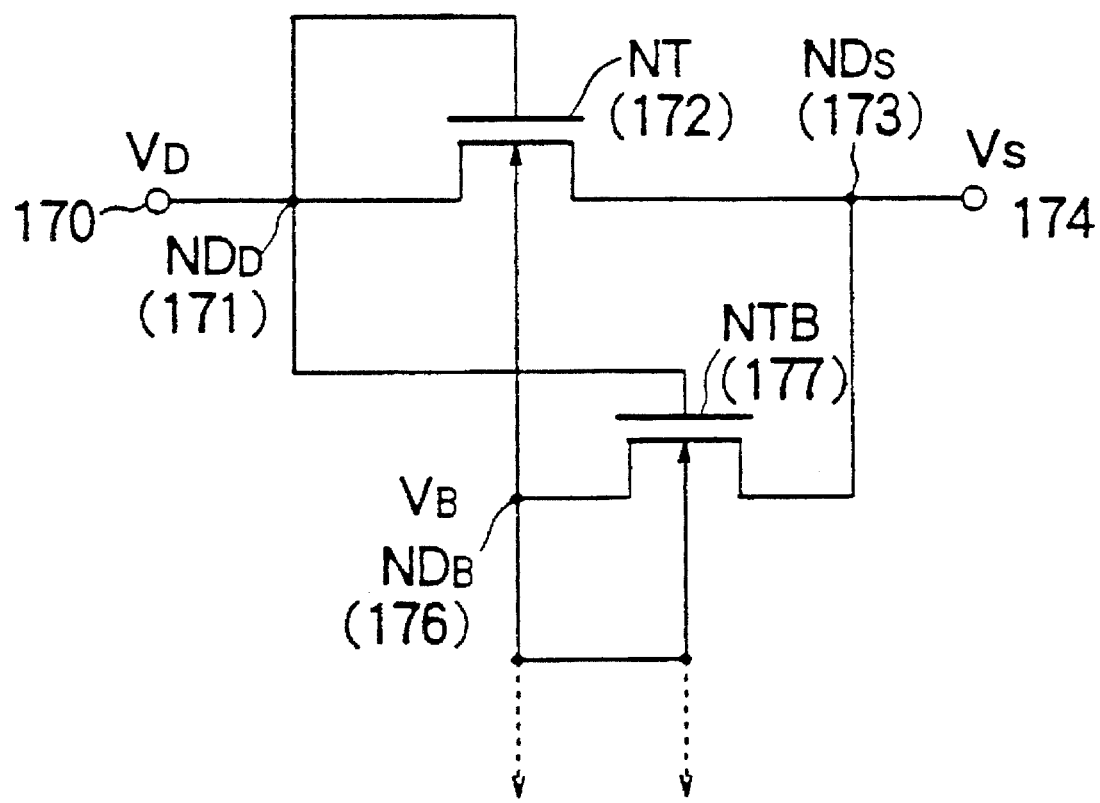
FIG. 10 is a view for explaining the basic operation of the booster circuit according to the present invention.

An explanation will be made below of the reason why the influence by the back bias effect can be cancelled using FIG. 10 showing the fundamental structure of one boosting stage.

First, in FIG. 10, where the node $ND_D$ (171) is boosted and the node $ND_S$ (173) is lowered, the relationship between the voltage $V_D$ of the node $ND_D$ (171) and the voltage $V_S$ of the node $ND_S$ (173) becomes as follows:

$$V_D > V_S$$

This voltage $V_D$ of a high level is supplied to the gate of the nMOS transistor NTB for transferring the voltage, and therefore the nMOS transistor NTB becomes the ON state and the voltage $V_S$ of the node $ND_S$ (173) and the voltage $V_B$ of the node $ND_B$ (176) become the same level ($V_S = V_B$).

Next, where the node $ND_D$ (171) is lowered and the node $ND_S$ (173) is boosted, the relationship between the voltage $V_D$ of the node $ND_D$ (171) and the voltage $V_S$ of the node $ND_S$ (173) becomes as follows:

$$V_D < V_S$$

Accordingly, the voltage $V_B$ of the node $ND_B$ (176) becomes the source voltage of the nMOS transistor NTB (177), that is, the differential voltage between the voltage $V_D$ and the threshold voltage $V_{th}$ as indicated next.

$$V_B = V_D - V_{th}$$

The voltage of the source of the nMOS transistor NTB (177) and the voltage of the substrate (p-well) at this time are equal, and therefore the threshold voltage $V_{th}$ of the nMOS transistor AFT (172) is no longer susceptible much to the influence of the back bias effect.

This is true even for a high boosting stage.

When considering this referring to the circuit of FIG. 7, the present circuit adopts a structure in which the voltages $V_1$ to $V_4$ of the nodes $ND_{31}$ to $ND_{34}$ (118 to 121) are changed in synchronization with the clock signals $\phi_{10}$ and $\phi_{10-}$ and fluctuate between for example $V_1 > V_2$ and $V_1 < V_2$; the nMOS transistors $NTB_{0W}$ to $NTB_{4W}$ (125 to 129) for transferring the voltage transfer the lower voltage; and (AND logics) between $V_0$ and $V_1$, $V_1$ and $V_2$, $V_2$ and $V_3$, $V_3$ and $V_4$ and $V_4$ and $V_5$ are taken, in other words, the source voltage is determined by the lower voltage.

An explanation will be made next of the operation by the above-described structure by taking as an example a case where the nodes $ND_{31}$ (118) and $ND_{32}$ (119) are complementarily boosted.

For example, when the clock signal $\phi_{10}$ (101) is input to the capacitor $C_{31}$ (111) at the $V_{cc}$ level, and the clock signal $\phi_{10\_}$ is input to the capacitor $C_{32}$ (112) at "0" V, the node $ND_{31}$ (118) is boosted (raised) by the amount of the voltage $V_c$ by the capacitance connection of the capacitor $C_{31}$ (111), and the node $ND_{32}$ (119) is lowered by the amount of the voltage $V_c$.

Along with the boosting of the node $ND_{31}$ (118), the voltage $V_c$ is applied to the gate of the nMOS transistor $NT_{1W}$ (126), and therefore the nMOS transistor $NT_{1W}$ (126) becomes the ON state, the current $i_2$ flows toward the node $ND_{32}$ (119) of the next stage, and the charges of the capacitor $C_{31}$ (111) are transported to the node $ND_{32}$ (119).

Along with this, the voltage $V_2$ of the node $ND_{32}$ (119) gradually rises.

At this time, a high voltage $V_1$ of the boosted node $ND_{31}$ (118) is applied to the gate of the nMOS transistor $NT_{1W}$ (126), and therefore the nMOS transistor $NTB_{1W}$ (106) becomes the ON state.

As a result, the voltage $V_2$ of the node $ND_{32}$ (119), that is, the voltage of the source of the nMOS transistor $NT_{1W}$ (126), and the voltage of the substrate well (source voltage of the nMOS transistor $NTB_{1W}$ (126) become the same level.

Here, when the clock signal $\phi_{10}$ (101) is input to the capacitor $C_{31}$ (111) at "0" V, and the clock signal $\phi_{10\_}$ (102) is input to the capacitor $C_{32}$ (112) at the $V_{cc}$ level, the node $ND_{31}$ (118) is lowered by the amount of the voltage $V_c$ since the capacitance connection of capacitor $C_{31}$ (111) is not carried out, and the node $ND_{32}$ (119) is raised by the amount of the voltage $V_c$. Accordingly, the voltage $V_2$ of the node $ND_{32}$ (119) becomes the value obtained by adding the amount of the voltage $V_c$ plus a certain margin which rose by the inflow of the current $i_1$.

On the other hand, the nMOS transistor $NT_{1W}$ (126) and the nMOS transistor $NTB_{1W}$ (106) become the OFF state since the gate voltage is lowered, and the current $i_1$ no longer flows.

Accordingly, the source voltage of the nMOS transistor $NTB_{1W}$ (106) becomes the differential voltage between the gate voltage of the nMOS transistor $NTB_{1W}$ (106), that is, the voltage $V_1$, and the threshold voltage $V_{th}$, i.e., $(V_1-V_{th})$.

The voltages of the source of the nMOS transistor NTB and the substrate well at this time are equal, and therefore the threshold voltage $V_{th}$ of the nMOS transistor $NT_{1W}$ (126) is not susceptible much to the influence of the back bias effect.

An operation similar to the above is successively repeated, and the predetermined high voltage output $V_{OUT}$ appears at the output terminal $T_{OUT}$.

As explained above, according to the present first embodiment, each boosting stage is constituted by forming the nMOS transistor NT for carrying the charges and the nMOS transistor NTB for transferring the voltage inside the p-well formed inside the n-well which is formed on the p-type semiconductor substrate and biased to the predetermined potential, and constituted so that the source voltage of the nMOS transistor NT for carrying the charges rising at the boosting is transferred via the nMOS transistor NTB for transferring the voltage to the substrate, that is, the p-well, and therefore it is possible to suppress the back bias effect. Accordingly, a circuit which can perform boosting to a high voltage by a small number of stages can be realized.

Also, the maximum value of the gate voltage can be made a low value of about the output voltage +0.8 V, which is lower than the conventional output voltage +2 to 3 V, and thus it is advantageous for the setting of the gate voltage resistance.

Further, since a capacitor for pumping the gates is unnecessary, the increase of the surface area of the circuit and the power consumption can be prevented, and since it is sufficient if there are two phases of $\phi$ and $\phi_{13}$ taking the complementary levels, there are advantages such that a circuit which is excellent in the current capability and has a wide operation range for low voltages can be realized.

Figure 11:
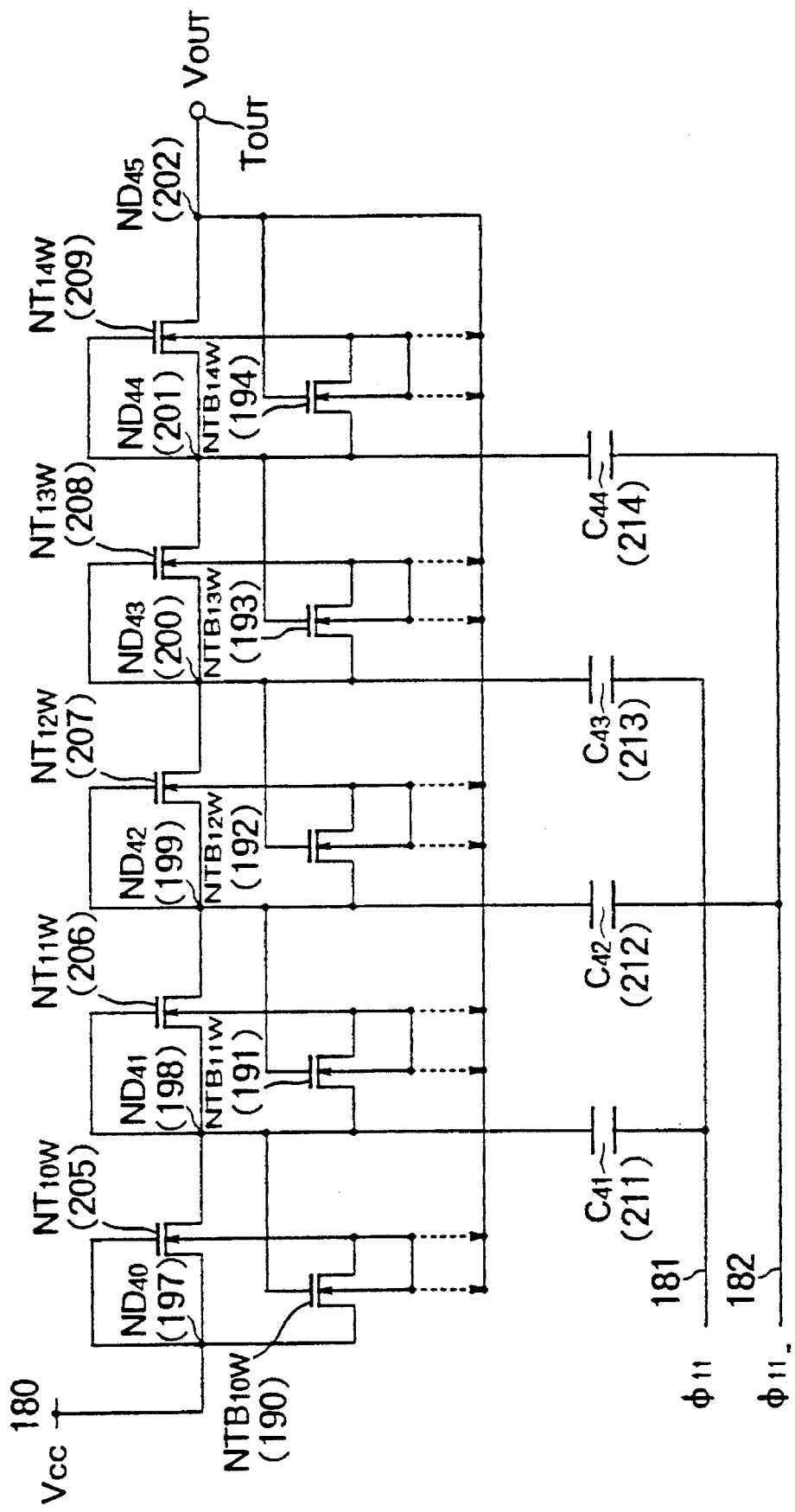
FIG. 11 is a circuit diagram showing a second embodiment of the booster circuit (positive booster circuit) according to the present invention.

FIG. 11 is a circuit diagram showing a second embodiment of the booster circuit according to the present invention.

The point of difference between the present embodiment and the above-described first embodiment is that the drain is connected to the input side node and the gate is connected to the output side node in place of having the drains of the voltage transfer nMOS transistors $NTB_{10W}$ to $NTB_{14W}$ (190 to 194) connected to the node of the output side of the boosting stage, and the gate connected to the input side node.

Figure 16:
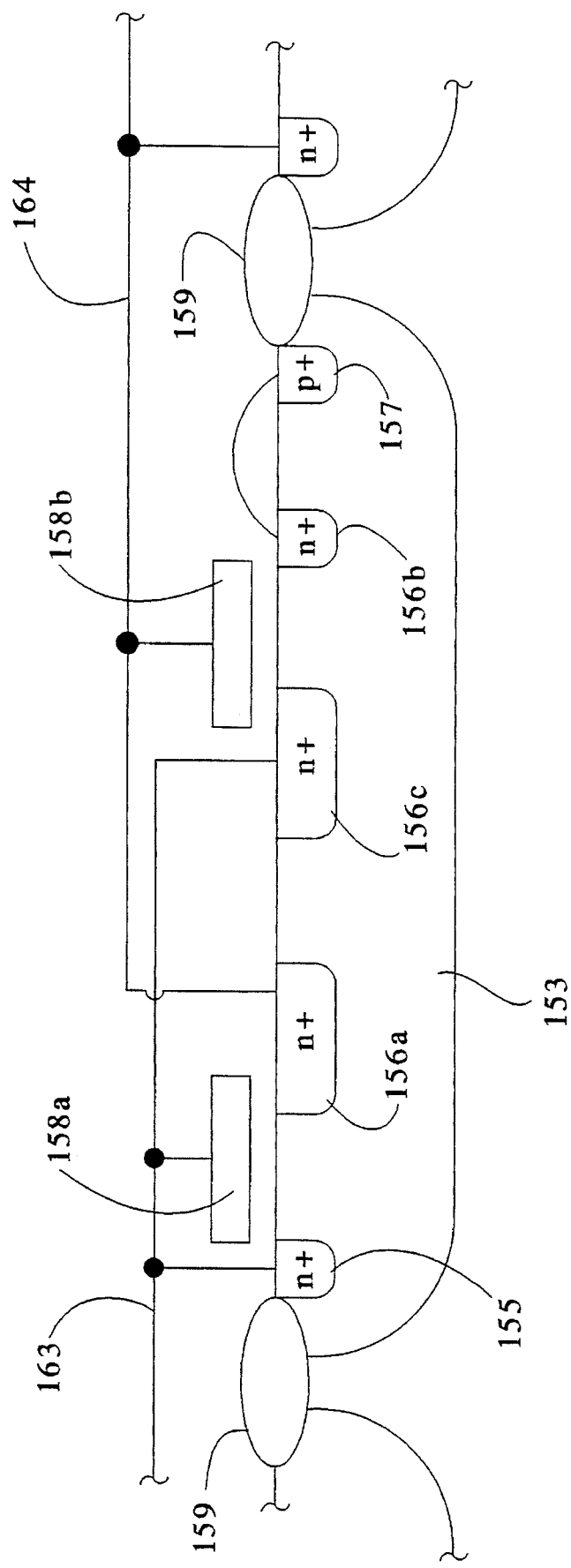
FIG. 16 is a schematic cross sectional view showing an example of constituting the principal part of the circuit of FIG. 11.

FIG. 16 diagrammatically shows this construction. It corresponds to the construction of FIG. 9, except that an additional side diffusion layer 158c is provided for the drain of the NTB transistor, which drain is connected to the input side node at line 163. The gate 158b of the NTB transistor is connected to the output node at line 164.

Namely, the drain of the nMOS transistor $NTB_{10W}$ (190) is connected to the node $ND_{40}$ (197), and the gate is connected to the node $ND_{41}$ (198).

The drain of the nMOS transistor $NTB_{11W}$ (191) is connected to the node $ND_{41}$ (198), and the gate is connected to the node $ND_{42}$ (199); the drain of the nMOS transistor $NTB_{12W}$ (192) is connected to the node $ND_{42}$ (199), and the gate is connected to the node $ND_{43}$ (200); the drain of the nMOS transistor $NTB_{13W}$ (193) is connected to the node $ND_{43}$ (200), and the gate is connected to the node $ND_{44}$ (201); and the drain of the nMOS transistor $NTB_{14W}$ (194) is connected to the node $ND_{44}$ (201), and the gate is connected to the node $ND_{45}$ (202).

The rest of the structure is similar to that of the first embodiment, and an effect the same as the effect of the above-mentioned first embodiment can be obtained.

Figure 12:
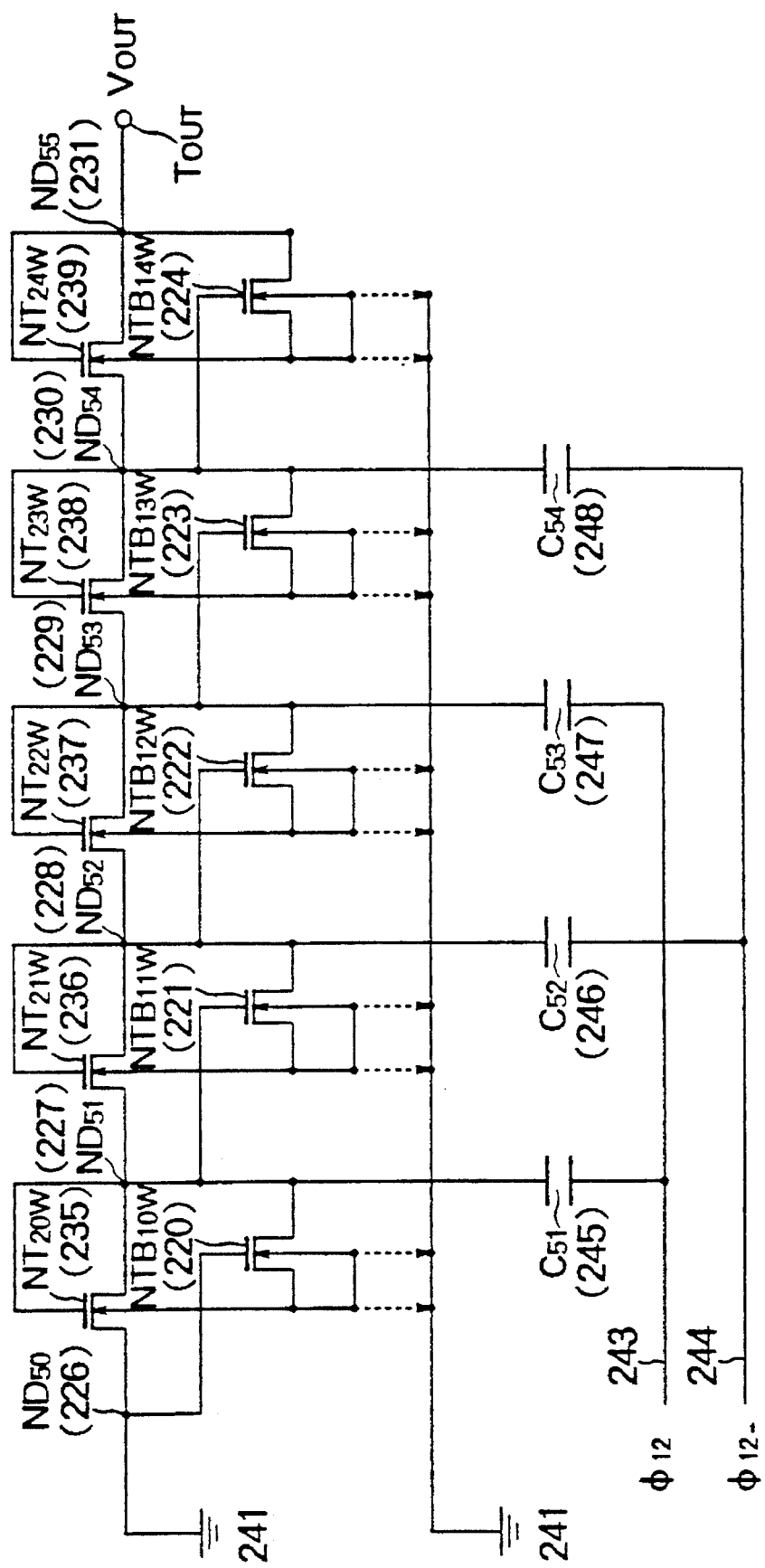
FIG. 12 is a circuit diagram showing a third embodiment of the booster circuit (negative booster circuit) according to the present invention.

FIG. 12 is a circuit diagram showing a third embodiment of the booster circuit according to the present invention.

The point of difference between the present embodiment and the above-described first embodiment is that, so as to constitute the negative booster circuit in place of the positive booster circuit, the gates of the respective charge carrying nMOS transistors $NT_{20W}$ to $NT_{24W}$ (235 to 239) are connected to the nodes on the source side in place of the nodes of drain side, the node $ND_{50}$ (226) is grounded in place of the connection to the positive power source voltage $V_{cc}$, and further the $n^+$ diffusion layer 134 of the n-well having the well-in-well construction is grounded in place of connection to the node $ND_{55}$ (231).

Namely, the gate of the nMOS transistor $NT_{20W}$ (235) is connected to the node $ND_{51}$ (227); the gate of the nMOS transistor $NT_{21W}$ (236) is connected to the node $ND_{52}$ (228); the gate of the nMOS transistor $NT_{22W}$ (237) is connected to the node $ND_{53}$ (229); the gate of the nMOS transistor $NT_{23W}$ (238) is connected to the node $ND_{54}$ (230); and the gate of the nMOS transistor $NT_{24W}$ (239) is connected to the node $ND_{55}$ (231).

In the present negative booster circuit also, in the same way as the above-mentioned first and second embodiments, the influence of the back bias effect can be effectively cancelled, and a negative high voltage of for example -20 V can be obtained by a small number of stages.

Figure 13:
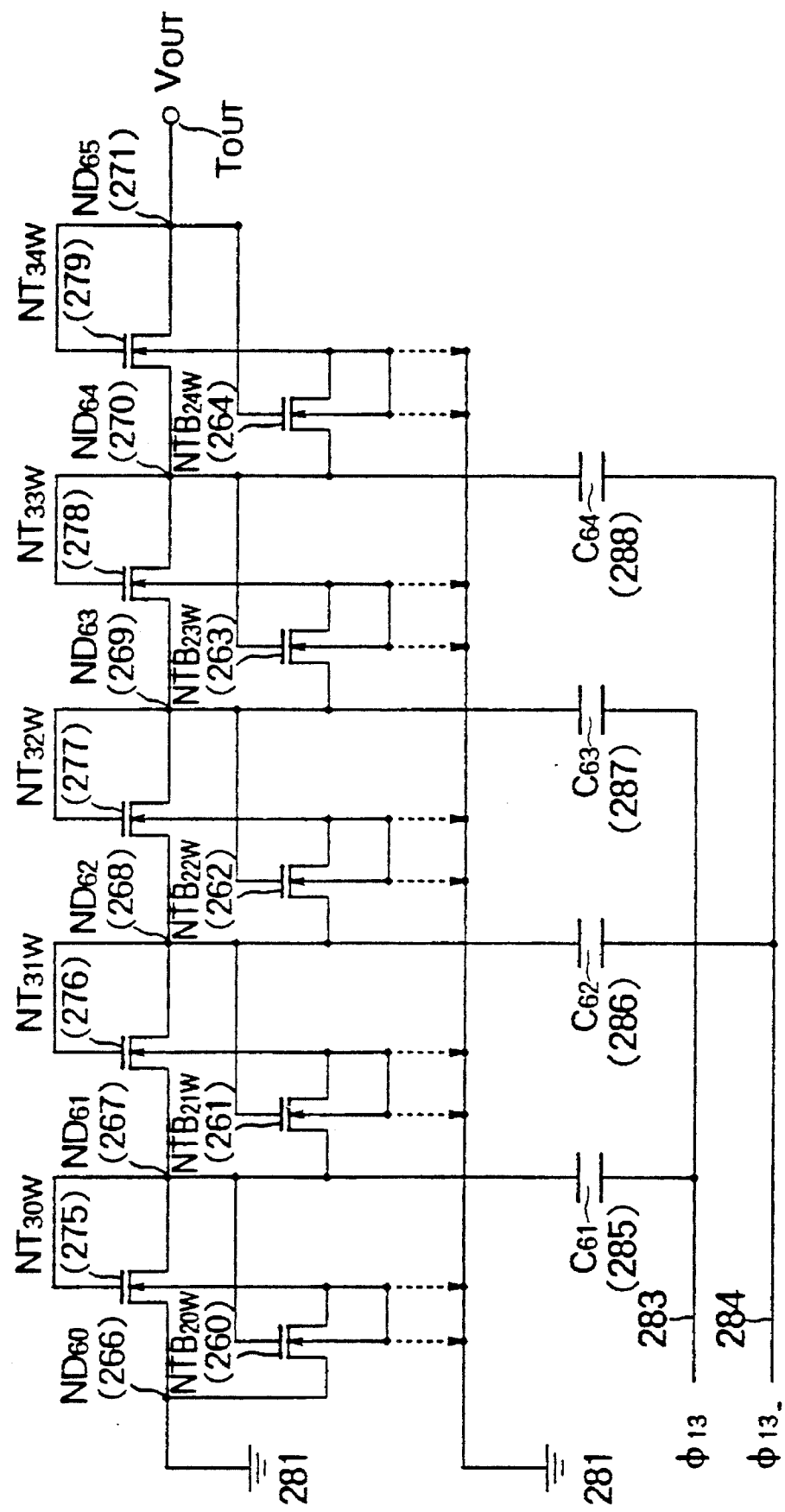
FIG. 13 is a circuit diagram showing a fourth embodiment of the booster circuit (negative booster circuit) according to the present invention.

FIG. 13 is a circuit diagram showing the third embodiment of the booster circuit according to the present invention.

The point of difference between the present embodiment and the above-described second embodiment is that, so as to constitute the negative booster circuit in place of the positive booster circuit, the gates of the respective charge carrying nMOS transistors $NT_{30W}$ to $NT_{34W}$ (275 to 279) are connected to the nodes on the source side in place of the nodes of the drain side, the node $ND_{60}$ (266) is grounded in place of the connection to the positive power source voltage $V_{cc}$, and further the $n^+$ diffusion layer 134 of the n-well having the well-in-well construction is grounded in place of connection to the node $ND_{65}$ (271).

Namely, the gate of the nMOS transistor $NT_{30W}$ (275) is connected to the node $ND_{61}$ (267); the gate of the nMOS transistor $NT_{31W}$ (276) is connected to the node $ND_{62}$ (268); the gate of the nMOS transistor $NT_{32W}$ (277) is connected to the node $ND_{63}$ (269); the gate of the nMOS transistor $NT_{33W}$ (278) is connected to the node $ND_{64}$ (270); and the gate of the nMOS transistor $NT_{34W}$ (279) is connected to the node $ND_{65}$ (271).

In the present negative booster circuit also, in the same way as the above-mentioned second embodiment, the influence of the back bias effect can be effectively cancelled, and a negative high voltage of for example −20 V can be obtained by a small number of stages.

Figure 14:
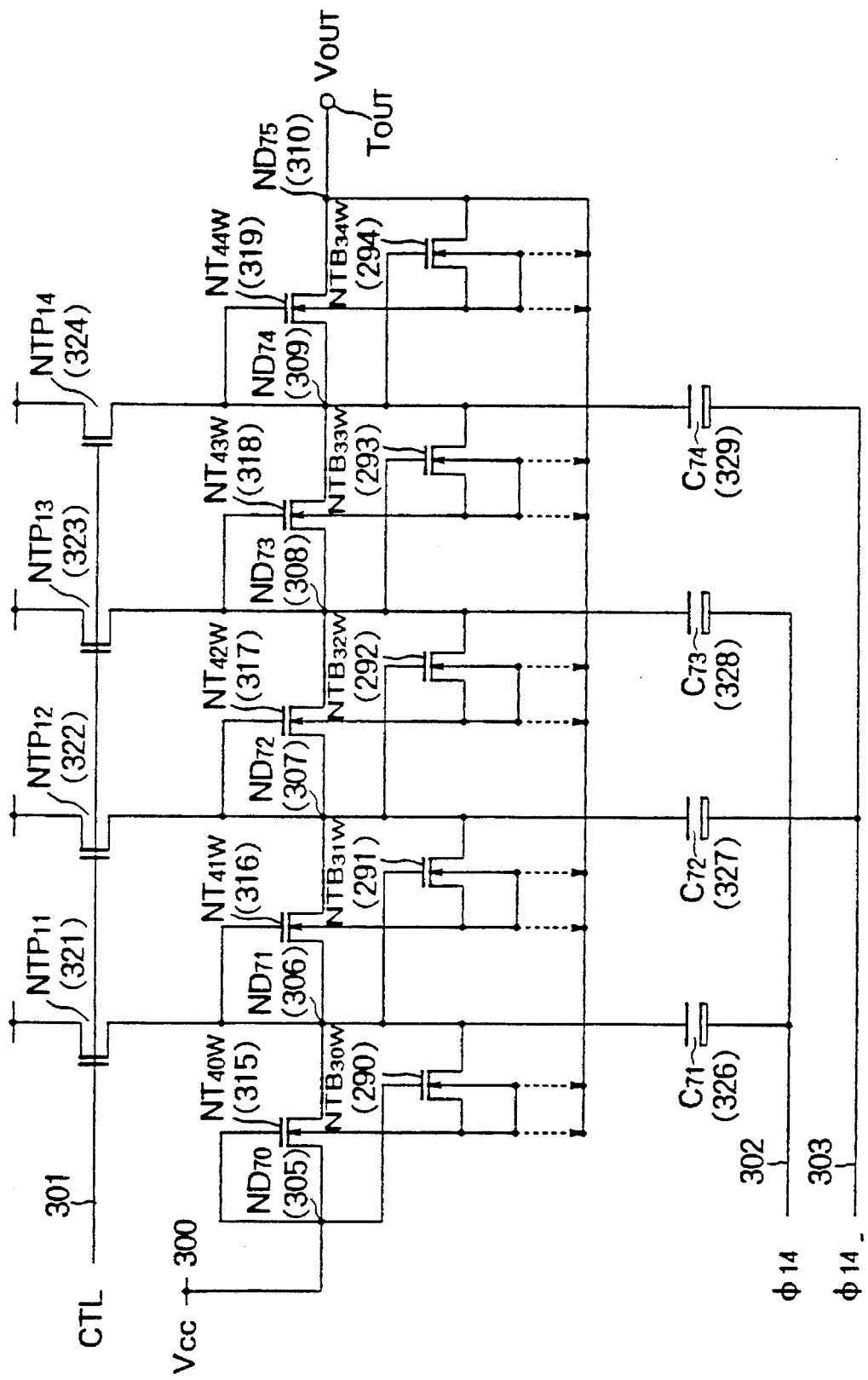
FIG. 14 is a circuit diagram showing a fifth embodiment of the booster circuit (positive booster circuit) according to the present invention.

FIG. 14 is a circuit diagram showing a fifth embodiment of the booster circuit according to the present invent ion.

The point of difference between the present embodiment and the above-described first embodiment is that the nMOS transistors $NTP_{11}$ to $NTP_{14}$ (321 to 324) for precharging the respective nodes $ND_{71}$ to $ND_{74}$ (306 to 309) of the boosting stage are provided.

The sources of the respective nMOS transistors $NTP_{11}$ to $NTP_{14}$ (321 to 324) are connected to the power source voltage $V_{cc}$; the drain of the nMOS transistor $NTP_{11}$ (321) is connected to the node $ND_{71}$ (306); the drain of the nMOS transistor $NTP_{22}$ (322) is connected to the node $ND_{72}$ (307); the drain of the nMOS transistor $NTP_{13}$ (323) is connected to the node $ND_{7\ 3}$ (308); the drain of the nMOS transistor $NTP_{14}$ (324) is connected to the node $ND_{74}$ (309); and the bases of the respective nMOS transistors $NTP_{11}$ to $NTP_{14}$ (321 to 324) are connected to the input line 301 of the control signal CTL.

In this way, by providing the precharging nMOS transistors $NTP_{11}$ to $NTP_{14}$ (321 to 324), the following effects are obtained in addition to the effect of the first embodiment mentioned above.

Namely, where there is no nMOS transistor for precharging, for example, the voltage of node $ND_{74}$ starts from 0 V, but when the clock signal $\phi_{14-}$ is input to the capacitor $C_{74}$ (329) at 0 V at this time, the node $ND_{74}$ (309) is lowered to the negative voltage. This can be prevented by providing the nMOS transistor $NTP_{14}$ (324) for precharging.

Also, where the precharging is not carried out, the gate voltage of the capacitor $C_{74}$ (329), that is, the voltage $V_4$ of the node $ND_{74}$ (309), does not exceed the threshold voltage $V_{th}$, and therefore there is a minus function such that all of the capacitance of the capacitor $C_{74}$ (329) is not seen as the capacitance, but this can be prevented by providing the nMOS transistor $NTP_{14}$ (324) for precharging.

Figure 15:
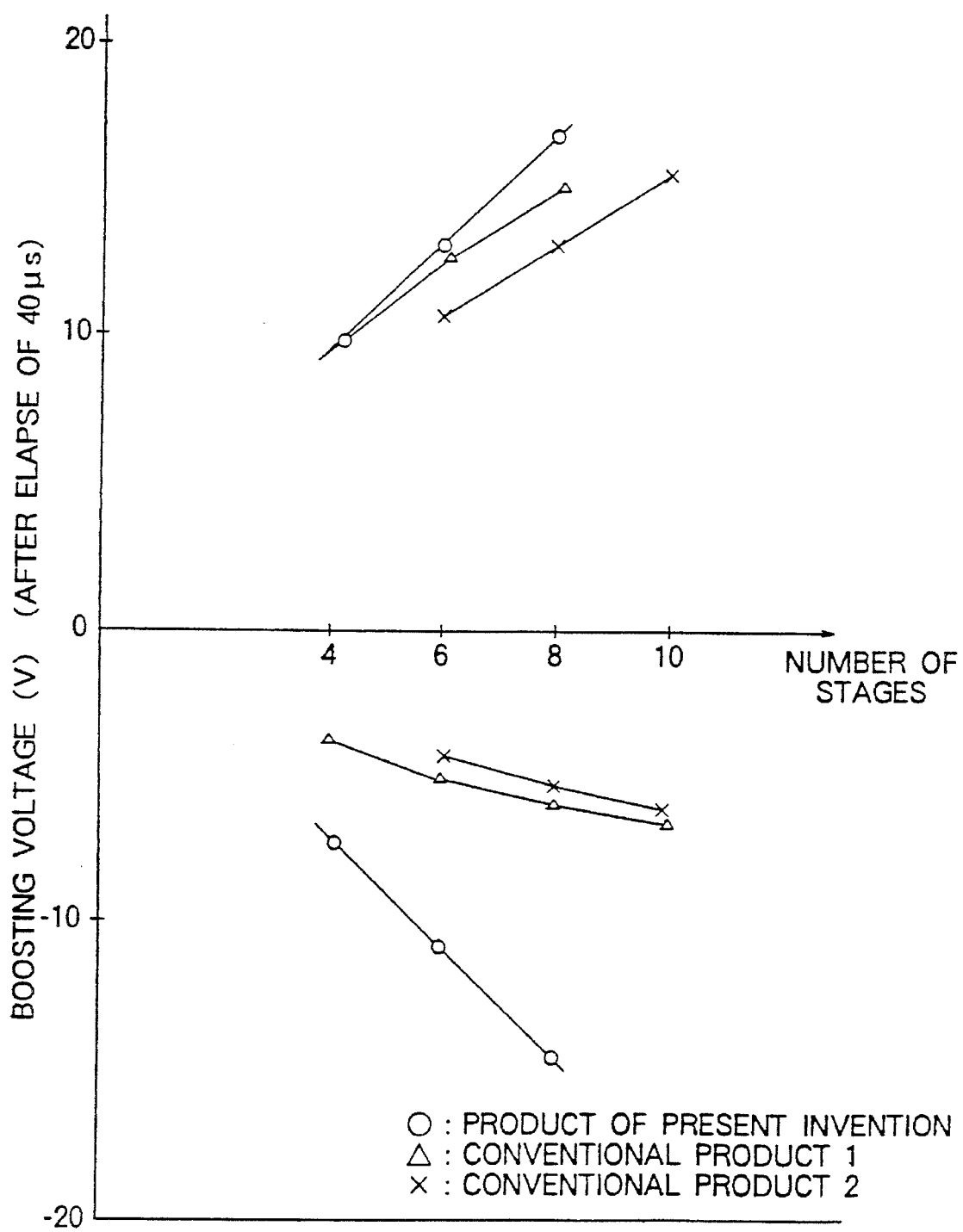
FIG. 15 is a view indicating the simulation results of the first circuit (product of the present invention) and the conventional circuits.

FIG. 15 is a view showing the results of a simulation for actually finding the number of the boosting stages and the result of the boosting voltage using the booster circuit according to the present invention and the conventional booster circuit.

In FIG. 15, an abscissa shows the number of the boosting stages and an ordinate shows the boosting voltage. The upper portion shows the results of simulation when the positive booster circuit is used, and the lower portion shows the results of simulation when the negative booster circuit is used.

In the diagram, a curve indicated by a mark "o" shows the results of simulation by the product of the present invention, and the curves indicated by the marks "Δ" and "x" show the results of simulation of two products, i.e., the conventional product 1 and the conventional product 2.

Figure 1:
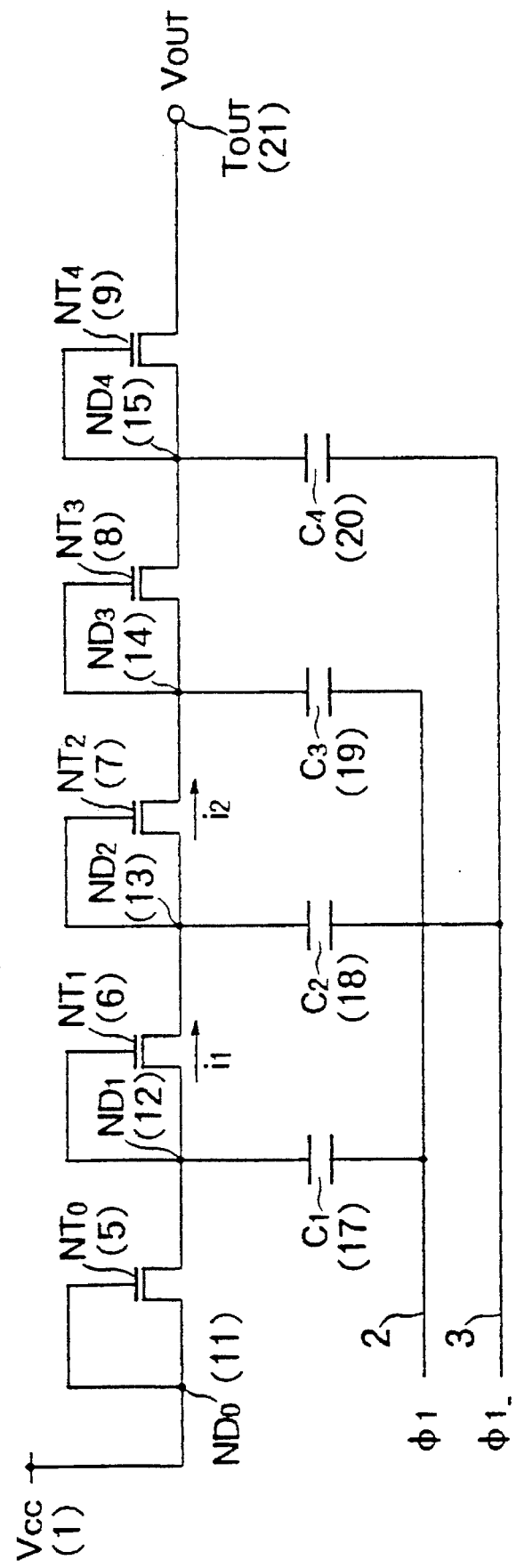
FIG. 1 is a circuit diagram showing one example of the conventional positive booster circuit.
Figure 2:
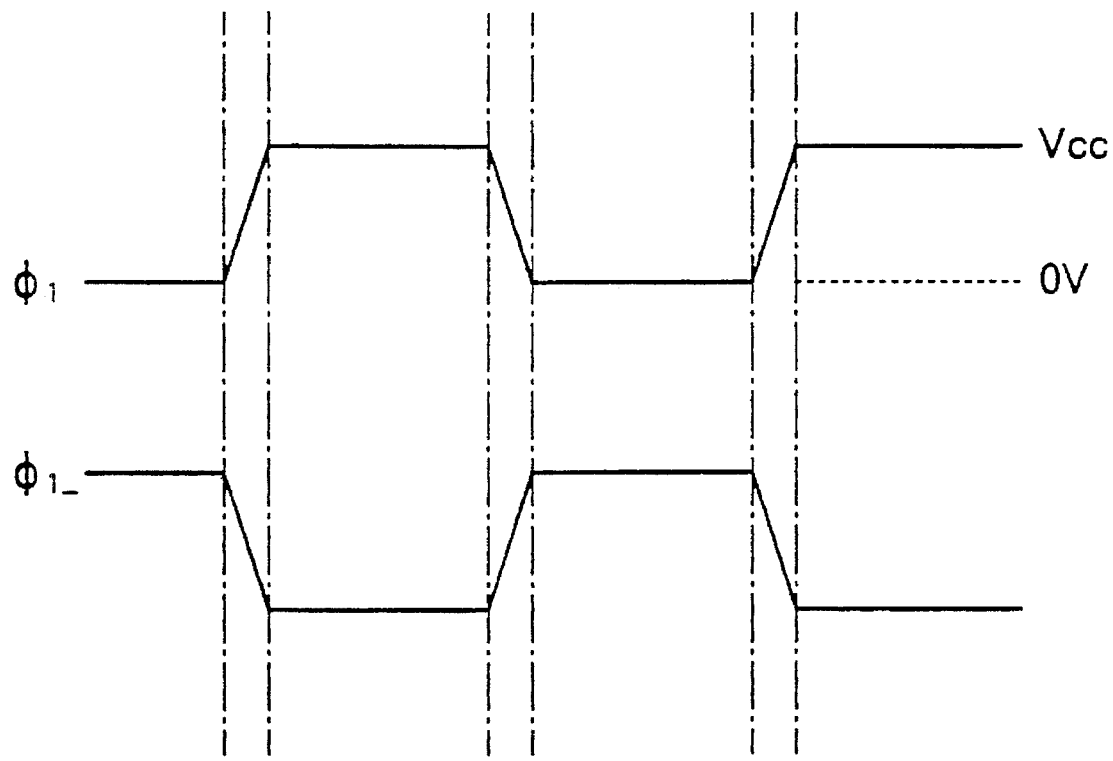
FIG. 2 is a view indicating an example of a waveform of the clock signal.
Figure 3:
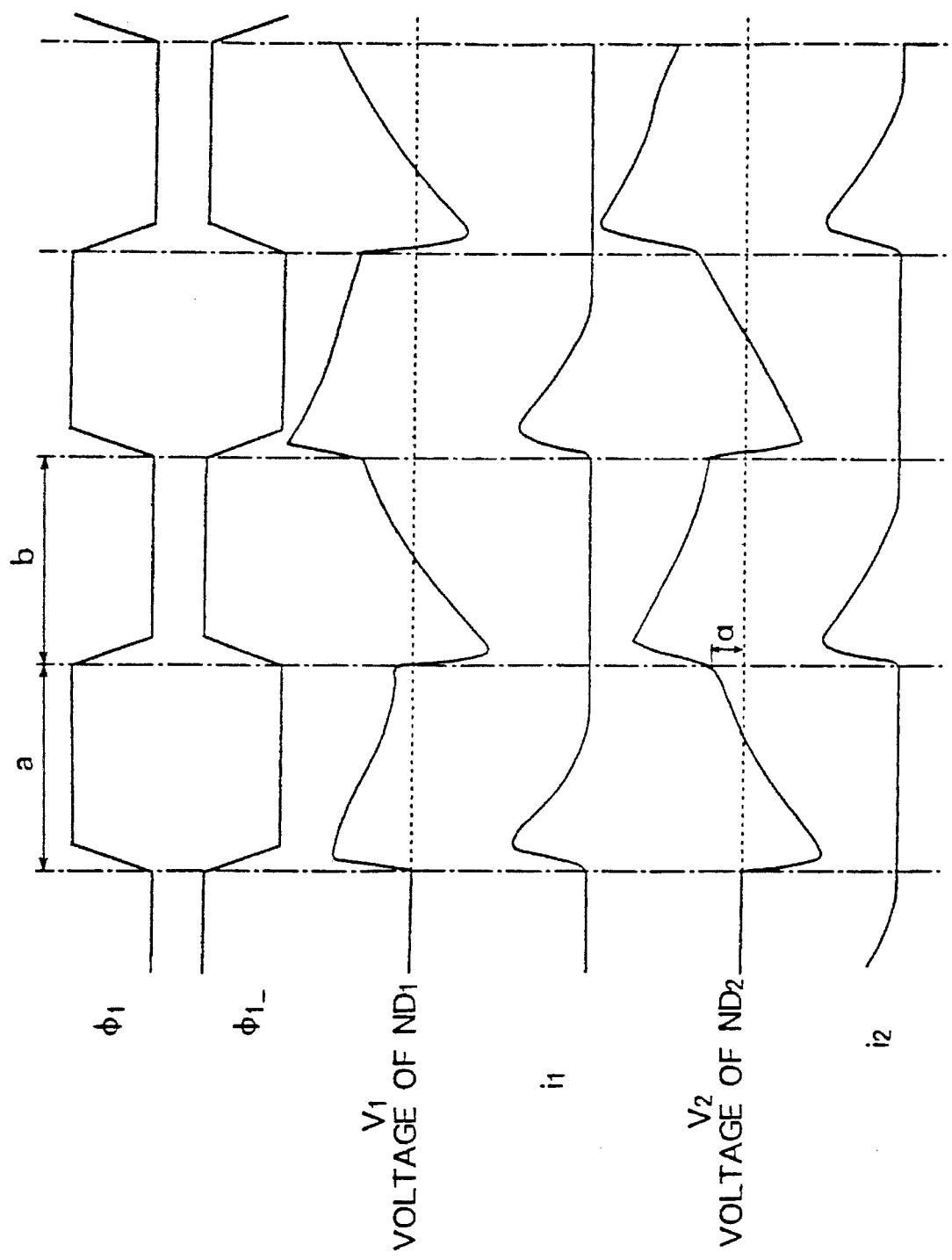
FIG. 3 is a waveform diagram for explaining the operation of the booster circuit of FIG. 1.
Figure 5:
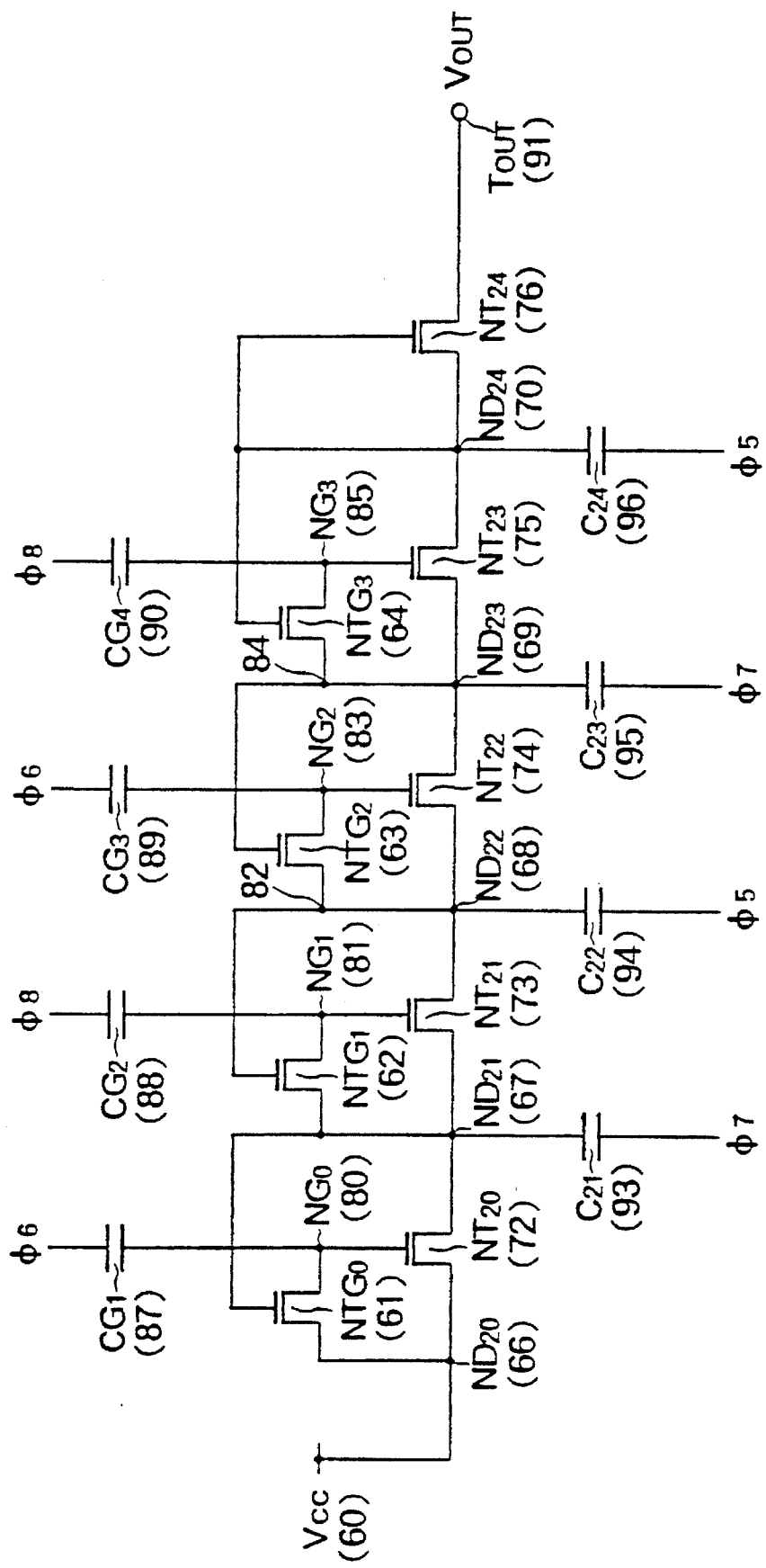
FIG. 5 is a circuit diagram showing another example of the conventional positive booster circuit.

As concrete circuits, a circuit shown in FIG. 14 was used as the product of the present invention of the positive booster circuit, a circuit of FIG. 5 was used as the conventional product 1, and a circuit obtained by adding the precharging function to the circuit structure of FIG. 1 was used as the conventional product 2.

Figure 4:
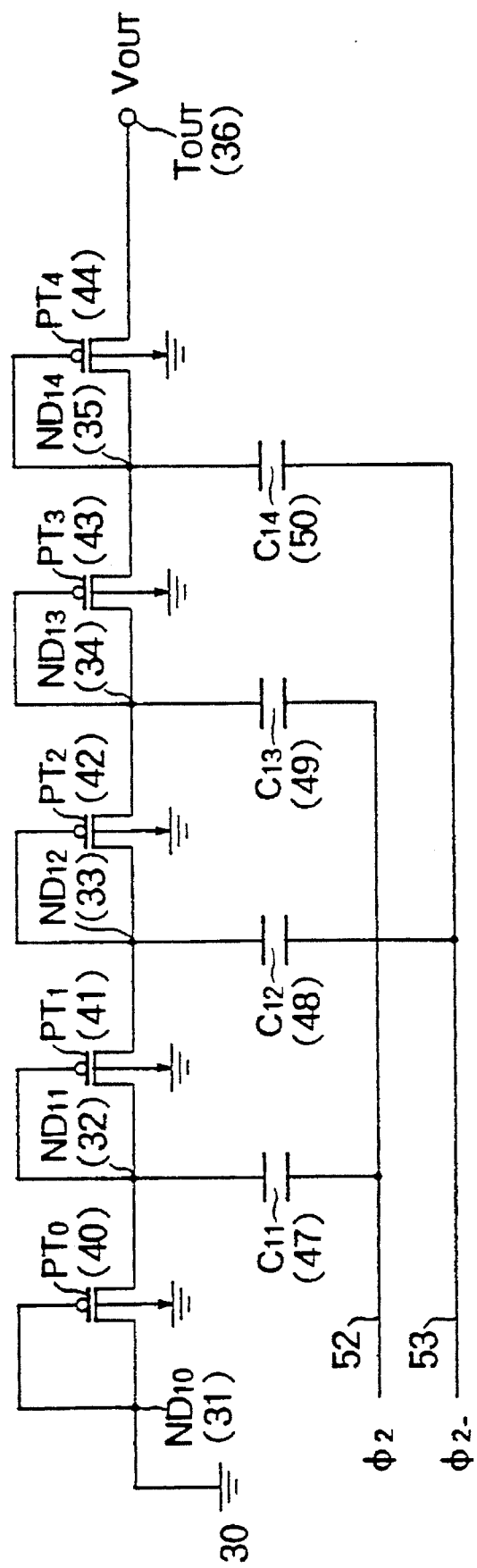
FIG. 4 is a circuit diagram showing one example of the conventional negative booster circuit.

Also, as the product of the present invention of the negative booster circuit, a circuit obtained by adding the precharging function to the circuit structure shown in FIG. 13 was used, a circuit constituted by applying the nMOS transistor to the circuit structure of FIG. 5 was used as the conventional product 1, and a circuit obtained by adding the precharging function to the circuit of FIG. 4 was used as the conventional product 2.

As seen from FIG. 15, the product of the present invention can perform boosting to a high voltage by a smaller number of stages in comparison with the conventional products 1 and 2.

As explained above, according to the present invention, the back bias effect can be suppressed. Accordingly, boosting to the high voltage can be carried out by a small number of stages.

Also, the maximum value of the gate voltage can be lowered to about +0.8 V, which is lower than the conventional output voltage +2 to 3 V, which is advantageous in the setting of the gate voltage resistance.

Since the gate pumping capacitor is unnecessary, the increase of the surface area of the circuit and the power consumption can be prevented.

Further, it is sufficient even if the clock signal has only two phases, and therefore there are advantages such that, not only can complication of the clock generation circuit be prevented, but also the current capability is excellent and the operation range is wide in the low voltage source direction.

What is claimed is:

1. A booster circuit comprising:
   a first transistor operatively connecting a first node and a second node which are connected to a boosting element and which are complementarily boosted and
   a second transistor which operatively connects the second node and a substrate well of said first transistor, said second transistor having a substrate well,
   said first node being connected to a gate of said first transistor and a gate of said second transistor, and said substrate well of said first transistor and said substrate well of said second transistor being connected.

2. A booster circuit comprising:
   a first transistor operatively connecting a first node and a second node which are connected to a boosting element and which are complementarily boosted and
   a second transistor which operatively connects said first node and a substrate well of said first transistor, said second transistor having a substrate well,
   said first node being connected to a gate of said first transistor, said second node being connected to a gate of said second transistor, and said substrate well of said first transistor and said substrate well of said second transistor being connected.

3. A booster circuit comprising:

a first substrate well comprising a first conductivity type semiconductor region biased to a predetermined potential;

a second substrate well comprising a second conductivity type semiconductor region formed in the first substrate well;

first, second, third, and fourth element side diffusion layers comprising at least three first conductivity type element side diffusion layers formed inside the second substrate well;

a first gate electrode formed on a space between said first and second element side diffusion layers; and a second gate electrode formed on the space between said third and second element side diffusion layers, said first element side diffusion layer being connected to said first and second gate electrodes, and said fourth element side diffusion layer being connected to said third element side diffusion layer.

4. A booster circuit comprising:

a first substrate well comprising a first conductivity type semiconductor region biased to a predetermined potential;

a second substrate well comprising a second conductivity type semiconductor region formed in the first substrate well;

first, second, third, and fourth element side diffusion layers comprising at least three first conductivity type element side diffusion layers formed inside the second substrate well;

a fifth element side diffusion layer comprising a second conductivity type element side diffusion layer formed inside the second substrate well;

a first gate electrode formed on a space between said first and second element side diffusion layers; and a second gate electrode formed on the space between said third and fourth element side diffusion layers, said first element side diffusion layer being connected to said third element side diffusion layer and first gate electrode, said second element side diffusion layer being connected to said second gate electrode, and said fourth element side diffusion layer being connected to said fifth element side diffusion layer.

5. A booster circuit as set forth in claim 3, wherein said first conductivity type comprises an n-type and said second conductivity type comprises a p-type.

6. A booster circuit as set forth in claim 4, wherein said first conductivity type comprises an n-type and said second conductivity type comprises a p-type.

* * * * *